United States Patent [19]

Maxner

[11] Patent Number: 4,499,649

[45] Date of Patent: Feb. 19, 1985

[54] ALL LEAD SENSOR

[75] Inventor: Richard B. Maxner, Danvers, Mass.

[73] Assignee: USM Corporation, Farmington, Conn.

[21] Appl. No.: 407,293

[22] Filed: Aug. 11, 1982

[51] Int. Cl.³ .................. H05K 3/30; B21F 11/00
[52] U.S. Cl. .................. 29/566.3; 29/564.8; 29/715; 250/227
[58] Field of Search .......... 29/33 M, 566, 566.1, 29/566.3, 564.8, 709, 710, 715, 741, 837, 838, 884; 250/227

[56] References Cited

U.S. PATENT DOCUMENTS

| | | | |
|---|---|---|---|
| 2,896,213 | 7/1959 | Alderman et al. | 29/566.3 |
| 3,188,478 | 6/1965 | Binks | 250/227 |
| 3,771,325 | 11/1973 | Sweeney et al. | 250/227 |
| 4,027,982 | 6/1977 | Ohishi | 250/227 |
| 4,063,347 | 12/1977 | Woodman, Jr. | 29/564.1 |
| 4,218,817 | 8/1980 | Takano | 29/741 |
| 4,286,379 | 9/1981 | Kawa et al. | 29/741 |
| 4,292,727 | 10/1981 | Maxner | 29/564.8 |

Primary Examiner—Z. R. Bilinsky
Assistant Examiner—Daniel W. Howell
Attorney, Agent, or Firm—Alan N. McCartney

[57] ABSTRACT

A mechanism for sensing that all the leads of a dual-in-line electrical component are in their proper position projecting through the appropriate openings in a printed circuit board. The sensor uses fiber optics to indicate that all the leads are properly positioned by using light reflected from the lead to activate a photo transistor which indicates to the computer controlling the machine operation that all the leads are properly positioned.

3 Claims, 5 Drawing Figures

ALL LEAD SENSOR

BACKGROUND OF THE INVENTION

Printed circuit boards are extensively used in the electronics industry and are usually provided with pre-formed openings or holes into which the leads of an electrical component are inserted. These electrical components are inserted into the boards by automatic equipment which is programmed to rapidly place the components into the proper holes of the printed circuit board. An example of such equipment is illustrated in U.S. Pat. No. 4,063,347. After the component is inserted into the board, the leads are cut and clinched or formed so that the component is locked onto the board. An example of such a cut-clinch unit is illustrated in U.S. Pat. No. 4,292,727 and the disclosure thereof is incorporated herein by reference.

During this operation of automatically inserting components into printed circuit boards it is necessary to provide inspection and checking means at each stage of the operation to assure that the operation was preformed properly. One such inspection is to determine that all the leads of the dual-in-line component are properly placed down through the openings in the board.

SUMMARY OF THE INVENTION

It is the object of this invention to provide a means to inspect that each lead of a dual-in-line component is properly placed down through the opening in a print circuit board during the operation of automatically inserting a component into the board.

It is a further object of the invention to provide an sensing means in the cut and clinch mechanism of component insertion equipment that will indicate whether all leads of a dual-in-line component are properly positioned down through the openings in a printed circuit board.

It is another object of the invention to provide a fiber optics sensor to indicate that all the leads of a dual-in-line component are down through their respective openings in a printed circuit board.

DESCRIPTION OF THE PREFERRED EMBODIMENT

Attention is now directed to the drawings which illustrate the fiber optic lead sensor of this invention. A fiber optic bundle is split so that one half of the bundle comes from a common light source to pass light to a support housing located in the cut-clinch unit. The light emitted strikes the lead of the component and is reflected to the pickup filament of the other half of the fiber optic bundle. This reflected light is transferred through the pickup filament to a photo transducer which is connected to an amplifier giving an input to a machine computer control. The machine computer control is operative to compare the response of the photo transducer with an expected result. The machine computer control will disable the cut and clinch mechanism if the comparison is not favorable.

Figure 1:
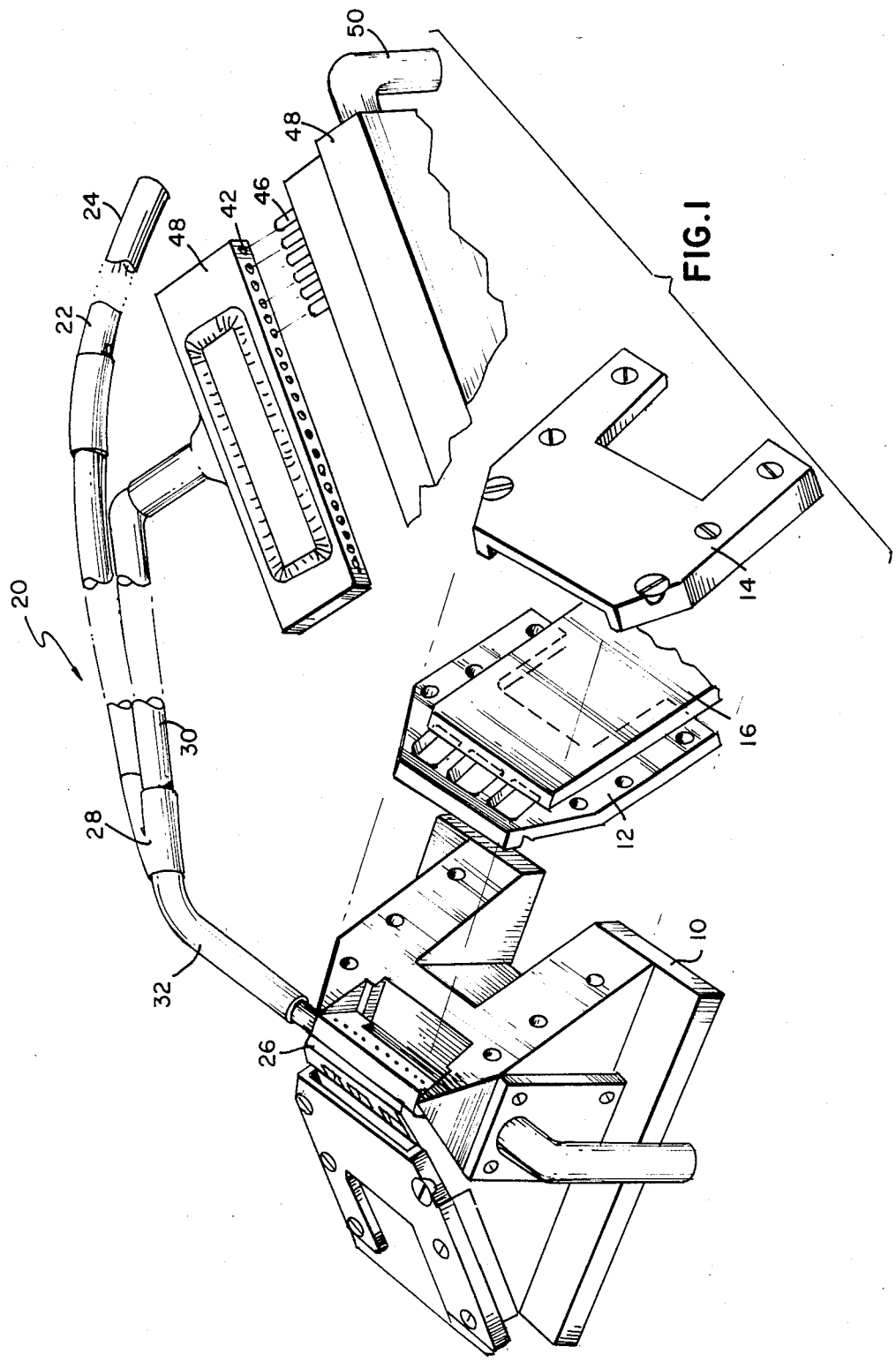
FIG. 1 is a perspective view of the fiber optics lead sensor of this invention.

In FIG. 1 there is illustrated a cut-clinch mechanism of the type illustrated in Maxner U.S. Pat. No. 4,292,727 in which the fiber optic sensor is located for purposes of illustration. There are other types of cut-clinch units, however, with which the fiber optic sensor of this invention could be utilized.

The cut-clinch unit comprises a block 10 on which fixed knives 12 are carried by a knife retainer 14 in which movable knife 16 is positioned. This cut-clinch unit is the same as illustrated in Maxner U.S. Pat. No. 4,292,727 and the disclosure of that patent is incorporated herein by reference.

Figure 2:
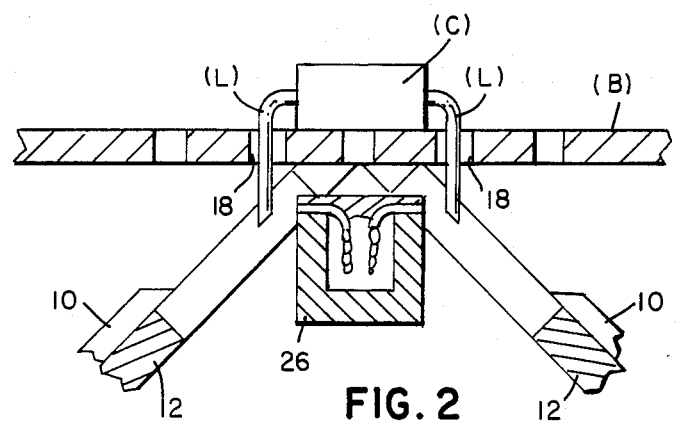
FIG. 2 is an enlarged sectional view showing the lead sensor being located in the cut-clinch unit and sensing lead location in the board.
Figure 3:
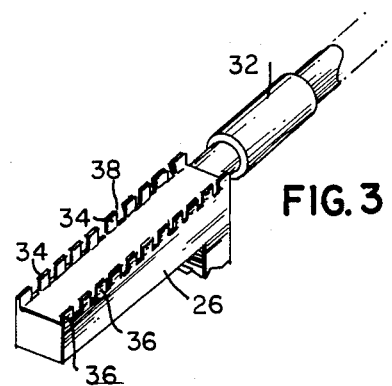
FIG. 3 is an enlarged view of the lead sensor housing with the fiber optic input and output line.

The cut-clinch unit is adapted to be positioned under the electrical component (C) which has its leads (L) inserted in the openings 18 printed circuit board (B) as illustrated in FIG. 2.

At this stage of assembly of electronic components, it is desirable for the machine control to know that all the leads of the component are properly positioned down through the openings in the printed circuit board. To this end, a fiber optic sensor 20 comprises a bundle of input filaments 22 passing light from a common light source 24 to a housing 26 located between the knives of the cut-clinch unit. The input 22 is joined at 28 to the pickup or output filament bundle 30 so that a combined bundle 32 of input and output filaments pass into the housing.

The housing 26 has a plurality of spaced upstanding opposed posts 34, 36 with the spaces 38 therebetween being equal to the approximate center spacing of adjacent leads of the dual-in-line component. Positioned between the posts 34, 36 in spaces 38 are the input 40 and output 42 filaments of the sensor. These filaments can be held in position by any convenient means such as holders 44.

Figure 5:
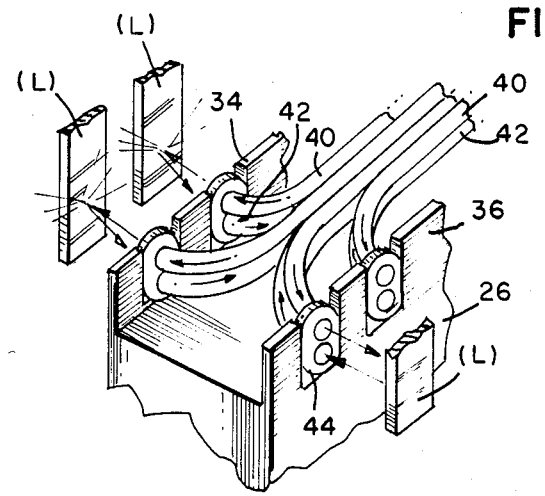
FIG. 5 is an enlarged view of the fiber optic input and reflection pickup from the component leads.

It can thus be seen that as the component leads (L) are in position, the light emitted by input filaments 40 is reflected off the lead (see FIG. 5) and picked-up by output filaments 42. This light from individual filaments is transmitted to photo transistors 46 through a coupling 48. The output 50 of the photo transistors goes to an amplifier and the computer controlling the functioning of the assembly machine. Thus, the operation of fiber optics sensor using the reflection of light from the leads will indicate to the computer control of the machine that all leads of the component are in place and the cut-clinch unit will then operate to secure the component to the board.

Figure 4:
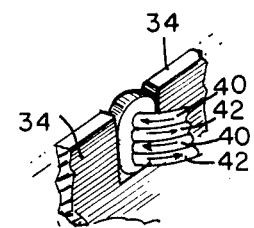
FIG. 4 is an enlarged illustration of the fiber optic input and pickup.

In FIG. 4 there is illustrated a dual input and dual output filament arrangement to facilitate the accuracy of the pick up of the proper positioning of the component leads. By the use of two input filaments 40 and two output filaments 42, the sensor is more adaptable for components of various lead lengths.

I claim:

1. In a component inserting machine, a sensor for indicating that leads of the component are located down through their proper opening in the printed circuit board, comprising:

a. a cut-clinch mechanism carried by the machine and located below the printed circuit board and adapted to cut and clinch the component leads to attach the component to the board;
b. said cut-clinch mechanism comprising a block carrying opposed fixed knives angularly disposed below the board and movable knives coacting with the fixed knives to cut and clinch the component leads extending down through the board;
c. a fiber optics sensor associated with the cut-clinch mechanism and adapted to sense whether the component leads are in position down through the board prior to the operation of the cut-clinch mechanism;
d. said sensor comprising a housing carried on said block between said fixed knives, said housing having a plurality of openings spaced the approximate spacing of the component leads with fiber optic input and output filaments positioned in said openings to sense the presence of the component leads wherein the fiber optic sensor is located within the cut-clinch mechanism and said input and output filaments transfer light to reflect off the component leads and coact with a machine control for proper functioning of the machine.

2. In the component inserting machine of claim 1 wherein said housing has a plurality of upstanding posts between said openings with fiber optic input and output filaments being attached to said posts and positioned in said openings, said input filaments transferring light onto the component leads and said output filaments collecting light reflected off said component leads.

3. In the component inserting machine of claim 1 wherein a fiber optic bundle of input and output filaments pass into said housing with said input filaments coming from a light source and said output filaments transmitting the indication of the presence or absence of light to a control of the operation of the cut-clinch mechanism.

* * * * *